United States Patent [19]

Nagesh et al.

[11] 4,130,671
[45] Dec. 19, 1978

[54] METHOD FOR PREPARING A THICK FILM CONDUCTOR

[75] Inventors: Voddarahalli K. Nagesh, Berkeley, Calif.; Richard M. Fulrath, deceased, late of Berkeley, Calif., by Marilyn M. Fulrath, executrix

[73] Assignee: The United States of America as represented by the United States Department of Energy, Washington, D.C.

[21] Appl. No.: 838,273

[22] Filed: Sep. 30, 1977

[51] Int. Cl.² .................. B05D 5/12; C03C 17/06; C03C 15/00
[52] U.S. Cl. .................. 427/125; 427/217; 427/229; 427/279; 427/309; 427/376 A; 427/377; 252/514; 252/512; 252/518; 65/60 C; 156/663
[58] Field of Search ............ 427/125, 217, 229, 279, 427/282, 309, 376 A, 377; 252/514, 512, 518; 65/60 C; 156/663

[56] References Cited

U.S. PATENT DOCUMENTS

| 2,950,996 | 8/1960 | Place et al. ............... 427/376 |
| 3,479,217 | 11/1969 | Spanoudis ............... 65/60 C |
| 3,718,608 | 2/1973 | Mason et al. ............... 252/514 |
| 3,804,647 | 4/1974 | Elmer et al. ............... 156/663 |

*Primary Examiner*—Michael F. Esposito
*Assistant Examiner*—Richard Bueker
*Attorney, Agent, or Firm*—Dean E. Carlson; Roger S. Gaither; L. E. Carnahan

[57] ABSTRACT

A method for preparing a thick film conductor which comprises providing surface active glass particles, mixing the surface active glass particles with a thermally decomposable organometallic compound, for example, a silver resinate, and then decomposing the organometallic compound by heating, thereby chemically depositing metal on the glass particles. The glass particle mixture is applied to a suitable substrate either before or after the organometallic compound is thermally decomposed. The resulting system is then fired in an oxidizing atmosphere, providing a microstructure of glass particles substantially uniformly coated with metal.

17 Claims, 4 Drawing Figures

THICK FILM OPTICAL TRANSMISSION MICROGRAPHS
(25% Ag, FIRING 600°C, .8 MIN.)

(a) SURFACE ACTIVE GLASS POWDER

62 μm

THICK FILM OPTICAL TRANSMISSION MICROGRAPHS
(25% Ag, FIRING 600°C, 8 MIN.)

(b) SURFACE PASSIVE GLASS POWDER

62 μm

METHOD FOR PREPARING A THICK FILM CONDUCTOR

BACKGROUND OF THE INVENTION

This invention was made at the Lawrence Berkeley Laboratory under Contract No. W-7405-ENG-48 between the Energy Research and Development Administration and the University of California.

This invention relates to the preparation of thick film conductors, particularly noble metal thick film conductors.

Hybrid integrated circuits are becoming increasingly important as a result of the miniaturization of electronic components, circuits, and systems. Thick films are extensively used as capacitors, conductors, and resistors in these hybrid circuits. They are also used in high power television circuits, microwave devices and other integrated circuit applications. Thick films have been used not only because they are reliable but also because they are economical.

A conductor thick film is essentially a film of a composite of glass and a metal, usually a noble metal, on a ceramic substrate, having a thickness of the order of a few mils. The glass content is small (about 15 w/o) in conventional films, and its purpose is to provide good bonding between metal and substrate. Thick films are differentiated from thin films both in mode of preparation and in their thickness. Thin films are essentially of a thickness ranging from a few thousand Å to a few microns and are normally vacuum evaporated, sputtered or chemically deposited.

Conventionally, conducting thick films having a mixture of glass and metal particles in a suitable proportion in an organic vehicle with a suitable viscosity are printed onto a substrate. The glass, usually a low softening glass, with a composition having an expansion coefficient less than that of the substrate (for example, 96 w/o Al$_2$O$_3$) is powdered to a micron size (1 μm–10 μm range) and mixed with the micron size (1 μm–10 μm range) metallic powder, normally a noble metal. Usually the metal content varies from 70 to 90 w/o of the solids. This mixture is then suspended in an organic vehicle which consists of a resin binder, solvent and additives to give a suitable viscosity. The liquid ratio is normally about 75 w/o depending on the viscosity. The liquid-solid mixture is screen printed onto an alumina substrate, and the system is dried and fired for a specific time at a given temperature to give a conducting thick film.

Conventionally, the purpose of the glass is to provide good bonding between the substrate and the metallic film and to hold the metallic particles together in the film. The microstructure of the fired system has glass particles interspersed with metallic particles in contact with one another as shown in FIG. 1a.

Because the present commercial thick film conductor compositions use about 70–90 w/o metal in the solids composition thick film circuits are a significant user of precious metals. Thus, a method which makes possible a substantial reduction in the amount of precious metal needed for good conductivity would be desirable.

SUMMARY OF THE INVENTION

The process of the present invention makes possible a substantial reduction in the amount of metal needed for good conductivity by using surface activated glass particles and then depositing the metal chemically on the particles, giving a substantially uniform and strong coating of the metal around the glass particles. More particularly, the present process comprises activating the glass surface by treating the glass particles with an acid under conditions such that a surface reaction takes place and then mixing the surface active glass particles with a thermally decomposable organometallic compound, preferably a noble metal resinate. The resulting mixture is then applied to a suitable substrate by conventional methods and the system is fired in an oxidizing atmosphere. The organometallic compound decomposes, depositing metal on the surface active glass particles, thereby providing a microstructure of glass particles coated with metal. FIG. 1b is a diagrammatic representation of this kind of microstructure. With this kind of microstructure it is possible to attain with a reduced metal content the same degree of conductivity as with conventional methods.

Thus, it is an object of this invention to provide a method for preparing a thick film conductor, particularly a noble metal thick film conductor.

It is another object of this invention to provide a method for preparing a thick film conductor which makes possible a reduction of metal content over conventional processes.

It is still another object of this invention to provide a method for preparing a thick film conductor which results in a microstructure of glass particles substantially uniformly coated with metal.

Other objects and advantages will be apparent from the following detailed description made with reference to the accompanying drawings.

DETAILED DESCRIPTION OF THE INVENTION

Figure 1A:
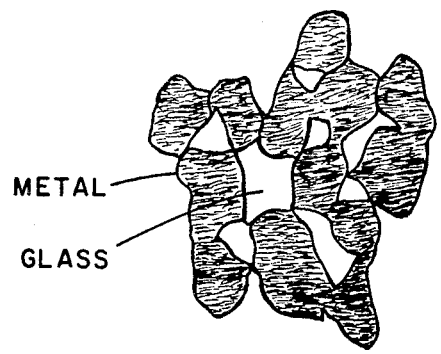
FIG. 1a is a diagrammatic representation of the microstructure of a conventional conductor thick film.
Figure 1B:
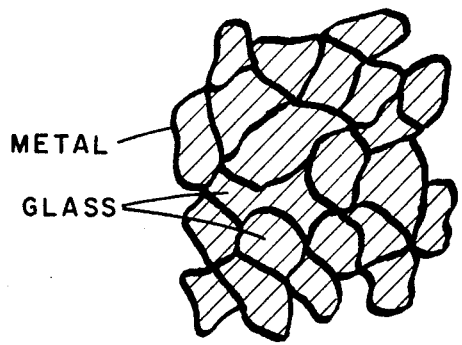
FIG. 1b is a diagrammatic representation of the microstructure of a conductor thick film wherein glass particles are uniformly coated with metal.

Broadly, the process of the present invention comprises providing surface active glass particles, mixing the surface active glass particles with a thermally decomposable organometallic compound, particularly an organo-compound of a noble metal, e.g., a silver resinate, and then decomposing the organometallic compound by heating, thereby chemically depositing metal on the glass particles. The glass particle mixture is applied to an insulator base material either before or after the decomposition step. More particularly, glass particles, having generally a particle size in the range of about 20–44 μm, are treated with an acidic material to activate the surface thereof. The thus surface activated glass particles are then suitably mixed with an organo-compound of a noble metal and the resulting mixture is suspended (after evaporating the solvent or after decomposing the organic compound) in a suitable organic vehicle for application to a suitable substrate. After the liquid-solid mixture is applied, as by screen printing or painting, the system is fired in an oxidizing atmosphere. The organo-metallic compound decomposes during the firing step, providing a microstructure of glass particles substantially uniformly coated with metal.

With the process of the present invention, conductivities of the order of $\approx 40$ m$\Omega$/□ (milliohms per square) with metal content as low as 40 w/o and of $\approx 70$ m$\Omega$/□ with only 30 w/o metal have been obtained, whereas conventional thick film conductors use as much as 80 w/o of precious metals to achieve conduction in the same range.

The particular glass composition used in the present invention depends on the thermal expansion of the substrate to which the glass/organometallic compound mixture is to be applied. It is well established in the art that it is very essential to match the thermal expansion coefficient of the substrate and the glass that is used in order to avoid any thermal stresses that may develop after firing. Surface activation of the glass particles involves essentially surface reactions with an acidic material for a given time depending upon the concentration of the acid. Preferably, dilute HCl is used for a time sufficient to etch the glass particles to a depth of from about 0.25 to 1 $\mu$m, depending on glass particle size. The activity of the surface is increased by an ion exchange reaction between metal ions of the glass and hydrogen ions of the acid, whereby a layer of hydrogen ions is placed on the surface of the glass particles, making the surface active since the hydrogen ions can subsequently enter into another ion exchange reaction with metal ions from the organometallic compound.

Preferably, conductor thick films utilize the precious or noble metals (silver, gold, platinum, or combinations of these metals with palladium) since firing is done in an oxidizing atmosphere. In the present process the metal is provided by thermal decomposition of a suitable thermally decomposable organometallic compound, more particularly, an organometallic compound which decomposes at a temperature below the firing temperature and which leaves no residue other than the metal. The preferred organometallic compounds are the noble metal resinates; such resinates are commercially available. The amount of organometallic compound used will depend upon the metal content desired in the final glass/metal composite. In order to achieve good conductivity the glass/metal composite should contain at least 20 w/o metal.

Generally, the organometallic compound used is dissolved in a suitable solvent for mixing with the glass particles. The organometallic compound/glass particle mixture is then heated to remove the solvent. Decomposition of the organometallic compound may be accomplished at this juncture in the process, prior to application to a substrate, simply by heating the mixture to a sufficiently high temperature. Alternatively, decomposition may be accomplished during the subsequent firing step. In either case, the organometallic compound decomposes to give the metal which coats the surface activated glass particles uniformly.

The glass/organometallic compound mixture (or glass/metal mixture) is then suspended in an organic vehicle consisting of a resin binder, solvent and additives to give a suitable viscosity, as is well known in the art (see Walter H. Kohl, *Handbook of Materials and Techniques for Vacuum Devices*, Chapter 15, Reinhold Publishing Corporation, 1967). The resulting "paint" is then applied by conventional methods such as painting or screen printing to an insulator base material, preferably a ceramic material such as alumina. The printed substrate is then fired in an oxidizing atmosphere under conditions as are known in the art to provide a conducting thick film. The temperature of firing should be less than the flow temperature so as not to disrupt the microstructure that is developed. This is particularly important in the present process as the glass phase is the major phase. For the time parameter, similar reasoning restricts the use of longer times. For the glass composition used in the example hereinafter described, the preferred firing temperature and time, to achieve good conductivity are about 500°–750° C. and about 8–30 minutes.

During firing, the organometallic compound decomposes, if not already decomposed by a previous heating operation, the metal is bound to the surface of the particles, and these particles viscously flow together and develop an interconnecting metallic film surrounding the glass particles, leading to maximum conduction with minimum silver content. While the exact mechanism behind the surface activation and glass/metal bonding is not known, the following is proposed, using, as an example, lead borosilicate glass etched with dilute HCl and mixed with silver resinate.

When the glass particles are etched, micropores are developed. In addition, the activity of the surface is increased by an ion exchange reaction. The ion exchange reaction proposed is between the H$^+$ ion in the acid and Pb$^{2+}$ ion in solution in the glass:

$$Pb^{2+} \text{ (on glass surface)} + 2H^+ \text{ (in acid solution)} \rightleftarrows$$
$$Pb^{2+} \text{ (in acid solution)} + 2H^+ \text{ (on glass surface)}$$

During thermal decomposition and firing in an oxidizing atmosphere the probable reactions are:

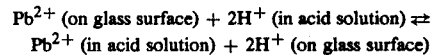

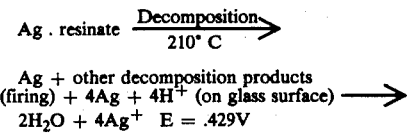

The Ag$^+$ ions diffuse into the interface to form a continuity in the chemical structure and give good bonding of Ag to glass.

The following example is illustrative of the present invention.

EXAMPLE

The glass used was a lead borosilicate glass having a softening temperature of approximately 450° C. The composition of the glass used for the thick film system was chosen to give an expansion coefficient equal to that of alumina ($\sim 8 \times 10^{-6}$/° C.). The composition was 70 wt% PbO, 20 wt% B$_2$O$_3$, 10 wt% SiO$_2$.

The glass was powdered using alumina balls in an organic lined mill with isopropyl alcohol as the liquid medium. After milling the glass was size separated and a particle size fraction between 20 and 44 $\mu$m was used for the experiments.

The surface treatment involved essentially surface reactions with dilute HCl (0.01N HCl and 0.25N HCl) for 45 seconds; 50 cc of acid was used for about 3 grams of glass powder.

The surface active glass powder (3–5 grams) was mixed with a silver resinate (15 w/o Ag in xylene as solvent) manufactured by Western Gold and Platinum Company. The metal content of the glass-metal mixture was controlled by controlling the amount of silver resinate used (10 gms. of solution gives ~0.15 gms. of Ag). The mixture was heated to 80° C. to evaporate the solvent and then suspended in about 1.2 gms. of the organic vehicle OIL 1014, manufactured by Drakenfield Colors, to form a paste with the proper viscosity for screen printing.

A stainless steel 200 mesh screen and squeegee were used to apply thick films of a definite pattern onto alumina substrates (96% alumina, 1" × 1" × 0.030").

After printing, the printed substrates were dried in air for 15 minutes and then fired in air. The temperature program consisted of raising the temperature at 16° C./min to the firing temperature, holding and allowing the substrate to furnace cool. Films were fired at different temperatures for different times.

Thick films formulated with untreated glass particles were also made following similar procedures of printing, drying and firing.

The electrical sheet resistivity of the fired systems was measured using the four point probe method.

The sheet resistivities of the different thick films obtained with surface activated glass particles and with varying metal contents are given in Table I.

Table 1

Sheet Resistivity of Silver Glass Thick Film Systems

| Silver Metal Content W/o | Surface Treatment (45 sec.) | Firing Temp. °C | Time Min. | Resistivity mΩ/□ |
|---|---|---|---|---|
| 40 | 0.25 N HCl | 550 | 8 | 44 |
| " | " | 575 | 14 | 32 |
| " | 0.01 N HCl | 500 | 20 | 80 |
| " | " | 500 | 30 | 120 |
| 30 | " | 600 | 8 | 85 |
| " | " | 640 | 8 | 70 |
| " | " | 700 | 8 | 80 |
| " | 0.01 N HCl | 500 | 8 | 160 |
| 25 | " | 600 | 8 | 165 |
| " | " | 700 | 8 | 160 |
| 20 | 0.01 N HCl | 500 | 30 | 230 |

As can be seen from Table I, sheet resistivities vary from 40 mΩ/□ to 230 mΩ/□. The thick films prepared with surface passive powders and with the same metal contents as above were essentially non-conductors (Ω/□ > $10^6$).

Figure 2A:
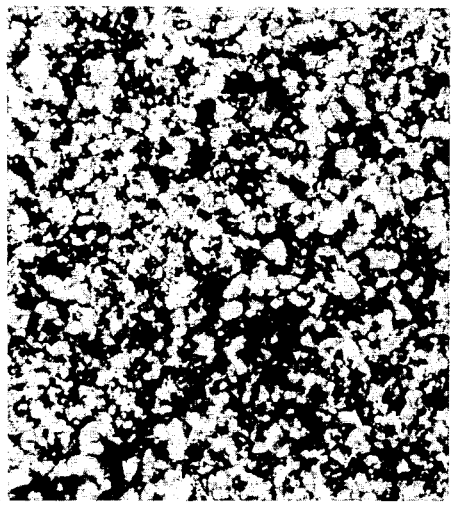
FIG. 2a is an optical transmission micrograph of a conductor thick film prepared with a surface active glass powder in accordance with the present invention (25 w/o Ag, firing 600° C., 8 min).
Figure 2B:
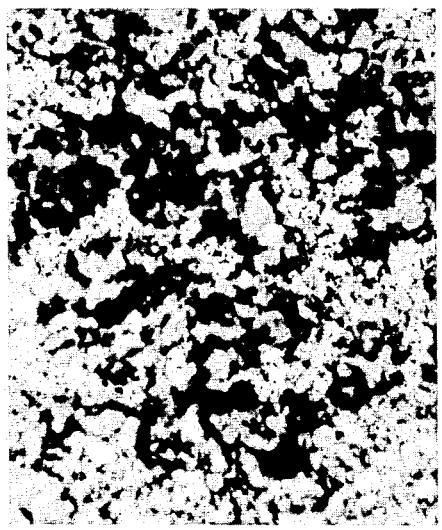
FIG. 2b is an optical transmission micrograph of a conductor thick film prepared with a surface passive glass powder in accordance with conventional techniques (25 w/o Ag, firing 600° C., 8 min).

The microstructures of a specimen prepared with a surface treated glass and of a specimen prepared with an untreated glass are shown in FIGS. 2a and 2b, respectively. For both specimens, the firing was the same (600° C., 8 minutes), and both had a silver content of 25 w/o. The untreated glass thick film had a high resistance and, as shown in FIG. 2b, the microstructure indicates agglomerated silver metal in a glass matrix. By contrast, there is good continuity of the metal in the treated glass thick film conductor as indicated by the microstructure shown in FIG. 2a. The sheet resistivity of the treated glass thick film (25 w/o precious metal) shown in FIG. 2a was 160 mΩ/□. This value compares favorably with a commercial Pt-Pd thick film which has about 80 w/o Pt and a sheet sensitivity of 50 mΩ/□.

Thus, it has been shown that the process of the present invention wherein a microstructure of glass particles substantially uniformly coated with metal is developed, conductor thick films having resistivities comparable to those of commercially available systems are obtained with reduced precious metal content.

Although the invention has been described with reference to a specific embodiment, various modifications will be apparent to those skilled in the art, and it is not intended to limit the invention except by the terms of the following claims.

What we claim is:

1. A method for preparing a thick film conductor wherein a composite of glass particles and a metal is formed on an insulator base material, which method comprises:
   providing glass particles that have been surface activated by hydrogen ion emplacement on the surface thereof;
   mixing the surface active glass particles with an amount of a thermally decomposable organo-compound of the metal sufficient to provide a metal content of at least about 20 weight percent in the glass-metal composite;
   applying the surface active glass particle mixture to an insulator base material;
   decomposing the organometallic compound by heating, thereby chemically depositing metal particles on the glass particles; and
   heating the resulting system in an oxidizing atmosphere under conditions to provide a thick film conductor, said conductor consisting essentially of the insulator base material having formed thereon a glass-metal composite having a microstructure of glass particles surrounded by an interconnecting metallic film chemically bonded to the glass particles at the glass-metal interface;
   the resulting thick film conductor having a sheet resistivity of less than about 230 milliohms per square.

2. A method according to claim 1 wherein the decomposition of the organometallic compound is accomplished prior to the step of applying the glass particle mixture to the insulator base material.

3. A method according to claim 1 wherein the decomposition of the organometallic compound is accomplished during the step of heating the system in an oxidizing atmosphere.

4. A method according to claim 1 wherein said metal is a noble metal.

5. A method according to claim 4 wherein the noble metal organo-compound is a noble metal resinate.

6. A method according to claim 5 wherein the noble metal resinate is silver resinate.

7. A method according to claim 1 wherein the surface active glass particles are provided by treating glass particles with an acidic material.

8. A method according to claim 7 wherein the size of the glass particles is in the range of from about 20 to about 40μ.

9. A method according to claim 8 wherein the glass particles are treated with an acid under conditions to etch the surface of the glass particles to a depth of from about 0.25 μm to about 1 μm.

10. A method according to claim 9 wherein the acid is dilute hydrochloric acid.

11. A method according to claim 7 wherein the metal is a noble metal.

12. A method according to claim 11 wherein the noble metal organo-compound is a silver resinate.

13. A method according to claim 1 wherein the resulting system is heated in an oxidizing atmosphere at a temperature in the range of from about 500° C. to about 750° C.

14. A method for preparing a thick film conductor wherein a composite of glass particles and a noble metal is formed on an insulator base material, which method comprises:

treating glass particles with an acidic material under conditions to react with and activate the surface thereof by emplacement of hydrogen ions thereon;

mixing the resulting surface active glass particles with an amount of a noble metal organometallic compound sufficient to provide at least about 20 weight percent of noble metal in the glass-noble metal composite;

applying the mixture of surface active glass particles and noble metal organometallic compound to an insulator base material; and heating the resulting system in an oxidizing atmosphere under conditions to decompose the noble metal organo-metallic compound, thereby depositing noble metal particles on the glass particles, and to provide a thick film conductor, said conductor consisting essentially of the insulator base material having formed thereon a glass-noble metal composite having a microstructure of glass particles surrounded by an interconnecting metallic film chemically bonded to the glass particles at the glass-metal interface; the resulting thick film conductor having a sheet resistivity of less than about 230 milliohms per square.

15. A method according to claim 14 wherein the noble metal organometallic compound is a silver resinate.

16. A method according to claim 14 wherein the resulting system is heated at a temperature in the range of from about 500° C. to about 750° C.

17. A method according to claim 14 wherein the glass particles are treated with an acid under conditions to etch the surface of the glass particles to a depth of from about 0.25 μm to about 1 μm.

* * * * *